United States Patent [19]

Yamamura et al.

[11] Patent Number: 4,600,282
[45] Date of Patent: Jul. 15, 1986

[54] ALIGNMENT APPARATUS

[75] Inventors: Mitsugu Yamamura, Yokohama; Minoru Yomoda, Kawasaki, both of Japan

[73] Assignee: Canon Kabushiki Kaisha, Tokyo, Japan

[21] Appl. No.: 667,993

[22] Filed: Nov. 5, 1984

[30] Foreign Application Priority Data

| Nov. 14, 1983 [JP] | Japan | 58-212490 |
| Nov. 18, 1983 [JP] | Japan | 58-215979 |
| Nov. 18, 1983 [JP] | Japan | 58-215981 |

[51] Int. Cl.⁴ ............................................. G03B 27/34
[52] U.S. Cl. ..................................... 353/122; 355/55; 353/101; 33/180 R
[58] Field of Search ........... 353/101, 122, 120, 180 R, 353/184.5; 355/44, 53, 54, 55, 56; 33/180 R

[56] References Cited

U.S. PATENT DOCUMENTS

4,344,160  8/1982  Gabriel et al.
4,420,233 12/1983  Nomoto et al. ............... 353/122
4,477,183 10/1984  Kawamura et al. ........... 355/53 X Primary Examiner—Harry N. Haroian
Attorney, Agent, or Firm—Fitzpatrick, Cella, Harper & Scinto

[57] ABSTRACT

An alignment apparatus for positioning on a wafer an image of a mask formed by a projection optical system. The apparatus includes a first detecting system for detecting the distance between an imaging plane of the optical system and the wafer, a driving mechanism for moving the wafer in the direction of the optical axis of the optical system and a second detecting system for detecting the amount of movement of the wafer. The driving mechanism is controlled while the distance detected by the first detecting system is compared with the amount of movement detected by the second detecting system, whereby the wafer is correctly and accurately positioned on the imaging plane of the optical system.

16 Claims, 11 Drawing Figures

OUTPUTS OF DIFF. AMPL. 45 &
SAWTOOTH WAVE GEN. 60

OUTPUT OF COMPARATOR 62

OUTPUT OF EACH OF AND
CIRCUITS 66 & 67

F I G. 6A

OUTPUTS OF DIFF. AMPL. 45 &
SAWTOOTH WAVE GEN. 60

OUTPUT OF COMPARATOR 62

OUTPUT OF EACH OF AND
CIRCUITS 66 & 67

F I G. 6B

OUTPUTS OF DIFF. AMPL. 45 &
SAWTOOTH WAVE GEN. 60

OUTPUT OF COMPARATOR 62

OUTPUT OF EACH OF AND
CIRCUITS 66 & 67

ALIGNMENT APPARATUS

BACKGROUND OF THE INVENTION

This invention relates to an alignment apparatus, usable in manufacture or observation of semiconductor devices such as integrated circuits, large scaled integrated circuits and very large scaled integrated circuits, for positioning a wafer with respect to an imaging plane of an optical system. More particularly, the invention relates to an alignment system, usable in a projection exposure apparatus, for positioning a wafer relative to the image of a mask.

A recent tendency to reduction in the minimum width of line in a circuit pattern constituting a semiconductor circuit device requires a higher resolving power even in a projection exposure apparatus. In order to achieve the higher resolving power, the position of each of a mask and a wafer must be accurately located at a focal point position of an imaging optical system of the projection exposure apparatus.

Such positioning or alignment in the exposure apparatuses has been performed by, for example, abutting an upper surface of a wafer, which has been flattened by means of a super-flat plate (wafer chuck) acting on the wafer from behind, against pawls formed at three points on a reference surface (wafer disk) located at a predetermined position. According to this method, however, an adhesive resist material applied to the wafer surface is liable to adhere to the pawls on the reference surface (wafer disk). The amount of resist adhesion increases with the increase in the number of the wafers treated. This obstructs accurate positioning of the wafer relative to the reference surface and results in disadvantageous defocus. Moreover, the areas of the wafer which abut against the pawls are not exposed to the image light of the photomask. This leads to a decreased yield of the semiconductor devices.

In order to overcome such problems, it has been proposed to detect the positional relation between the wafer and the imaging plane of the optical system in a non-contact manner such as optically, acoustically or with the use of air, and to adjust the position of the wafer relative to the imaging plane on the basis of the results of detection. U.S. Pat. No. 4,344,160 issued Aug. 10, 1982 discloses a system of such. In the system disclosed in this patent, there are provided a plurality of distance detectors and a plurality of drive sources, corresponding respectively to the distance detectors, for moving the surface of an object, i.e. the wafer, in the direction of an optical axis to thereby position the wafer relative to the imaging plane. This position adjustment is also effective to flatten the wafer surface.

However, this system involves inconveniences such as follows:

In this system, all the position detectors are opposed to one, the same flat plate and, in accordance with a detection signal supplied from each detector, an associated one of the drive sources is controlled. This means that the actuation of one of the drive sources affects the detection information of each of the other detectors. In other words, when one of the drive sources is actuated, in response to the detection information supplied from an associated one of the detectors, to move the surface of the object in the direction of optical axis to a predetermined point, the positional information of the other detectors varies. It is therefore difficult to achieve high speed and high precision positioning by means of these combinations of the detectors with the drive sources. In some cases, the positioning movement will not be terminated and oscillation will occur. In these cases, it is necessary to examine the interrelation between each of the drive sources and a corresponding one of the detectors to effect matrix control on the basis of high speed computation of the examined interrelation. This processing is not easy and requires a complicated control system. Further, if the detectors are spaced apart from the driving sources or if the positional relation with respect to the horizontal direction is variable, the position control becomes more and more difficult. For these reasons, the system disclosed in the aforementioned U.S. Patent can not easily be incorporated into a projection exposure apparatus having a mechanism in which a drive source is movable horizontally relative to a detector.

SUMMARY OF THE INVENTION

It is a primary object of the present invention to provide an alignment system or apparatus capable of quickly and accurately positioning an object relative to an imaging plane of an optical system.

Another object of the present invention is to provide an alignment apparatus capable of quickly and accurately positioning a flat plate relative to an imaging plane of an optical system.

A further object of the present invention is to provide an alignment apparatus capable of quickly and accurately aligning a wafer with a mask image formed by a projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
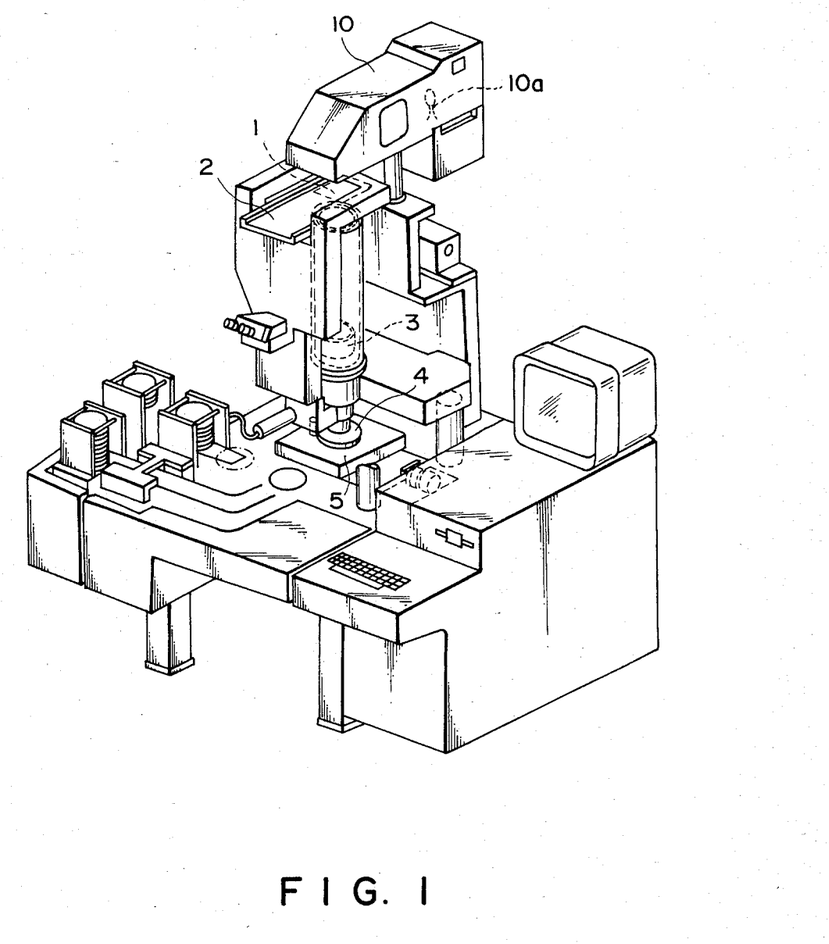
FIG. 1 is a perspective view showing an example of a projection exposure apparatus to which an alignment apparatus of the present invention is applicable.

Referring first to FIG. 1 showing an example of a reduction projection exposure apparatus to which an alignment apparatus according to the present invention is applicable, the projection exposure apparatus includes an illuminating optical system 10 for converging mask illuminating light emitted from a light source 10a. A mask 1 having an integrated circuit pattern is held by a mask chuck 2. The circuit pattern on the mask 1 is projected by a reduction projection lens 3 onto a wafer 4 having a sensitive layer. The wafer 4 is supported by a wafer stage 5 for movement in a plane (X-Y plane) which is perpendicular to the optical axis of of the reduction projection lens 3. On the wafer stage 5, there is provided a wafer Z-unit of the present invention (not shown in this Figure) for moving the wafer 4 in the direction of the optical axis of the reduction projection lens, i.e. in Z-axis direction.

Figure 2:
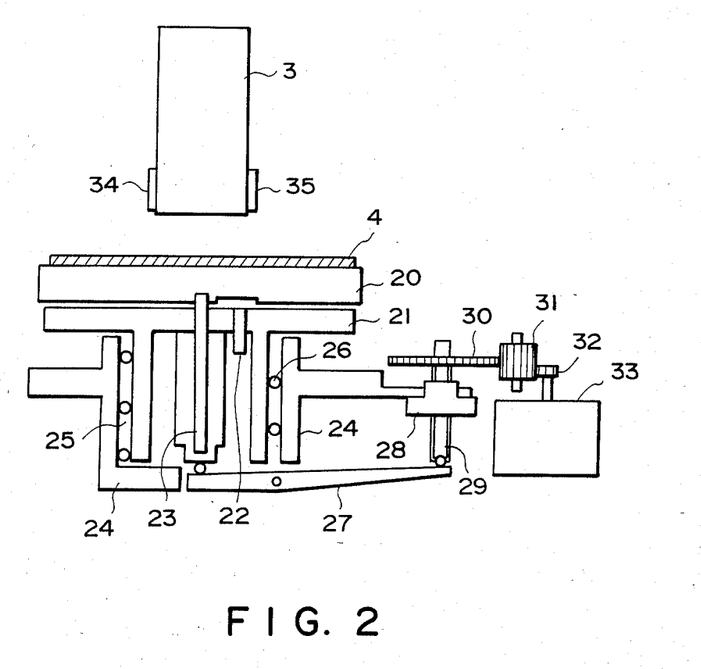
FIG. 2 is a cross-sectional view showing an alignment apparatus according to one embodiment of the present invention.

FIG. 2 shows the arrangement of the wafer Z-unit and the positional relation between the reduction projection lens 3 and the wafer Z-unit. As shown in this Figure, the wafer 4 is held by a wafer chuck 20. An electrostrictive element such as a piezoelectric device 23 is provided which has one end in pressure-contact with the wafer chuck 20 and another end in pressure-contact with the bottom of a container for the piezoelectric device 23, so that the wafer chuck 20 is movable longitudinally as viewed in this Figure by the expansion/contraction of the piezoelectric device 23. A lever 27 is provided to move, through the container for the piezoelectric device 23, a base member 21 of the wafer chuck 20 longitudinally as viewed in this Figure relative to a wafer chuck holder 24. The wafer chuck holder 24 is fixedly secured to the wafer stage 5 (FIG. 1). Ball bushing guides 25 and 26 are provided to accurately move the base member 21 in the Z-axis direction relative to the wafer chuck holder 24.

A screw 28 is fixedly secured to the wafer chuck holder 24 and a rod screw 29 engages with the screw 28. A gear 30 is mounted on the rod screw 29 and engages with an idler gear 31. The idler gear 31 in turn engages with a gear 32 mounted on an output shaft of a stepping motor 33. The rotation of the stepping motor 33 is transmitted through gears 32, 31 and 30 to the rod screw 29 so that it is rotated and moved longitudinally as viewed in this Figure. The longitudinal movement of the rod screw 29 acts on one end of the lever 27 whereby the surface of the wafer 4 is moved to a position coincident with the imaging plane of the projection lens 3.

An eddy current type position detector 22 is provided in order to detect the amount of driving movement of the piezoelectric device 23 and is secured to the base member 21. The position detector 22 is arranged to measure the distance between the base member 21 and the wafer chuck 20. Designated by reference numerals 34 and 35 in FIG. 2 are nozzles of the air-microsensors secured to the reduction projection lens 3. Each of the air-microsensors is adapted to measure the distance to the wafer surface on the basis of the changes in the flow rate or back pressure of the air blown off from the nozzle.

Figure 3:
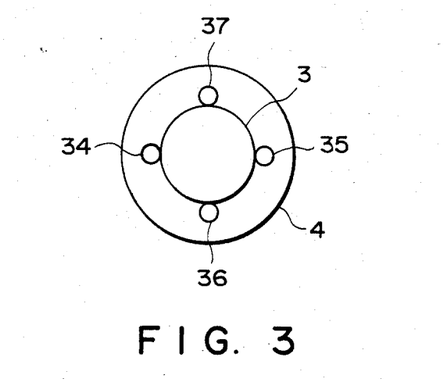
FIG. 3 is a plan view showing the positional relation of air-microsensors relative to a wafer.

The positional relation between the reduction projection lens 3, the air-microsensors and the wafer 4 is shown in FIG. 3. As shown in this Figure, there are provided four air-microsensors having nozzles 34–37. These air-microsensors are mounted on the outer periphery of the reduction projection lens 3 substantially equiangularly, so that they are spaced from each other through an angular distance of approx. 90 degrees along the outer periphery of the projection lens 3. Each of the airmicrosensors 34–37 is adapted to measure the distance to the wafer 4 surface. If the distances from the end face portions of the reduction projection lens 3 to the wafer 4 surface portions measured by the air-microsensors 34–37 are denoted by $d_1$, $d_2$, $d_3$ and $d_4$, the average distance can be expressed by:

$$(d_1+d_2+d_3+d_4)/4.$$

If the distance between the focal surface of the reduction projection lens 3 and the end face of the reduction projection lens 3 is denoted by $d_0$, the amount of movement $\Delta d$ required for moving the wafer through the wafer Z-mechanism to a position which is coincident with the focal surface of the reduction projection lens 3 can be expressed by:

$$\Delta d = d_0 - (d_1+d_2+d_3+d_4)/4$$

As the result of such movement, the average surface of the wafer is coincident with the focal surface of the reduction projection lens 3.

Figure 4:
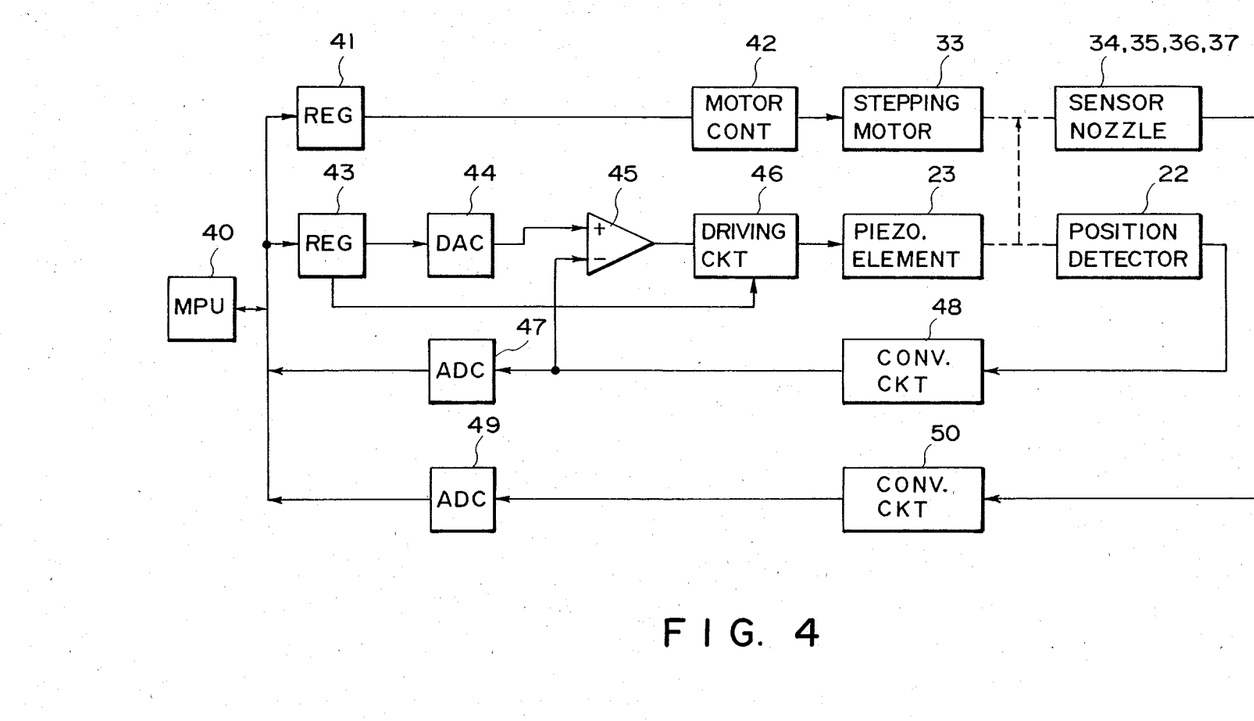
FIG. 4 is a block diagram showing a control system of the alignment apparatus shown in FIG. 2.

FIG. 4 is a block diagram showing the structure of the drive control system of the alignment apparatus according to the embodiment shown in FIG. 2. In the diagram of FIG. 4, a microprocessor unit (MPU) 40 is arranged to perform various discriminating operations and to provide instructions in accordance with different situations. A register 41 is adapted to store various instruction information on the direction, amount, speed, etc. of the rotation of the stepping motor 33 supplied from the microprocessor 40. Responsive to the instruction information outputted from the register 41, a stepping motor control circuit 42 performs open-loop control for the stepping motor 33.

In the initial state, the position of the wafer 4 surface is spaced from the focal surface position through a distance not less than 2 mm. This is for the purpose of preventing any contact of the wafer with the reduction projection lens 3 even in a case where the wafer has a large thickness. Each of the air-sensor nozzles 34–37 can achieve accurate measurement only when the distance from the end face of the nozzle to the wafer surface is not greater than approx. 0.2 mm. Thus, if the predetermined focal surface position is at a distance of 0.1 mm from the end face of the nozzle, accurate measurement can not be achieved until the wafer surface moving upwardly reaches a position which is downwardly spaced from the focal surface position through a distance of approx. 0.1 mm.

The control system further includes a converting circuit 50 for converting, into a voltage, the change in the flow rate in each of the air-sensor nozzles 34–37 to thereby produce voltage outputs $V_1$, $V_2$, $V_3$ and $V_4$ corresponding respectively to the distances $d_1$, $d_2$, $d_3$ and $d_4$ from the end face portions of the reduction production lens 3 to the wafer surface portions. An analog-to-digital converter (ADC) 49 converts the voltages $V_1$, $V_2$, $V_3$ and $V_4$ produced by the converter circuit 50 into digital signals, respectively, and supplies them to the microprocessor 40. Since, at this time, the initial position of the wafer 4 is spaced from the focal surface position through a distance not less than 2 mm, the microprocessor 40 continues to apply to the register 41 the drive instruction signal for the stepping motor 33 until the wafer 4 moving upwardly in the Z-axis direction enters into the measurement range of the air-sensor nozzle. When the distance from the wafer 4 which is being moved in the Z-axis direction by the rotation of the stepping motor 33 to the focal surface position becomes equal to or less than 0.1 mm, the microprocessor 40 detects the fact that the wafer 4 has entered into the measurement ranges of the air-sensor nozzles with the aid of the air-sensor nozzles 34—37, converter circuit 50 and A/D converter circuit 49. Responsive to this detection, the microprocessor 40 supplies a stop instruction signal to the register 41 to stop the rotation of the stepping motor 33, to thereby stop the upward movement of the wafer 4. Subsequently, the microprocessor 40 again performs measurement of the position of the wafer 4 surface with the aid of the air-sensor nozzles 34-37, converter circuit 50 and A/D converter circuit 49, and calculates the amount of movement of the wafer Z-unit, i.e.:

$$\Delta d_1 = d_0 - (d_1 + d_2 + d_3 + d_4)/4.$$

The movement resolution, i.e. the minimum increment of movement of the wafer 4 to be caused by the stepwise rotation of the stepping motor 33 is 2 microns. Thus, the microprocessor 40 applies to the register 41 an instruction signal for the amount of movement $\Delta d_1$, which is in 2-micron units, to move the wafer 4 upwardly in the Z-axis direction. As a result, the wafer 4 surface is positioned relative to the focal surface position with a precision on the order of no greater than approx. 2 microns.

Subsequently, the distances from the end face portions of the reduction projection lens 3 to the surface portions of the wafer 4 are measured again. When the distances measured by the air-sensor nozzles 34–37 are denoted by $d_9$–$d_{12}$, respectively, the microprocessor 40 supplies the register 43 with an instruction signal on the direction and amount of the driving movement of the piezoelectric device 23, which can be expressed by:

$$d_2 = d_0 - (d_9 + d_{10} + d_{11} + d_{12})/4$$

The register 43 stores the thus supplied information as well as the supplied information on whether or not the piezoelectric device is to be driven. In addition thereto, the register 43 supplies the information to a digital-to-analog converter (DAC) 44 and to a driving circuit 46 which generates a voltage to drive the piezoelectric device 23.

The D/A converter 44 converts the information from the microprocessor 40 into an analog voltage and supplies it to a differential amplifier 45 as an instruction voltage. In accordance with an output from the differential amplifier 45, the driving circuit 46 generates a voltage within a range having a center level which is approximately a half of the maximum voltage $V_H$ applicable to the piezoelectric device 23. As the wafer 4 is displaced longitudinally as viewed in FIG. 2 with the drive of the piezoelectric device 23, the amount of driving movement can be detected and measured by the air-sensor nozzles 34–37 and by the eddy current type position detector 22. The output of the eddy current type position detector 22 is converted by a displacement-to-voltage converter circuit 48 into a voltage which is proportional to the amount of displacement, the voltage being applied to the differential amplifier 45 and an analog-to-digital converter (ADC) 47. The differential amplifier 45 successively or sequentially compares the amount of movement of the wafer 4 (driven by the piezoelectric device 23) detected by the eddy current type position detector 22 with the amount of driving movement instructed by the microprocessor 40, and continues to actuate the driving circuit 46 until the difference found by the comparison falls within a predetermined permissible error range. As the result of that, the surface of the wafer 4 can be precisely positioned relative to the predetermined focal surface position. The A/D converter 47 converts the amount of drive of the piezoelectric device 23 detected by the eddy current type position detector 22 into a digial signal and supplies it to the microprocessor 40. Use of an eddy current type position detector as the second detector means is because the response speed thereof is low. If, on the other hand, an air-sensor is employed to form a servo loop, the time until the positioning movement is terminated becomes longer.

Figure 5:
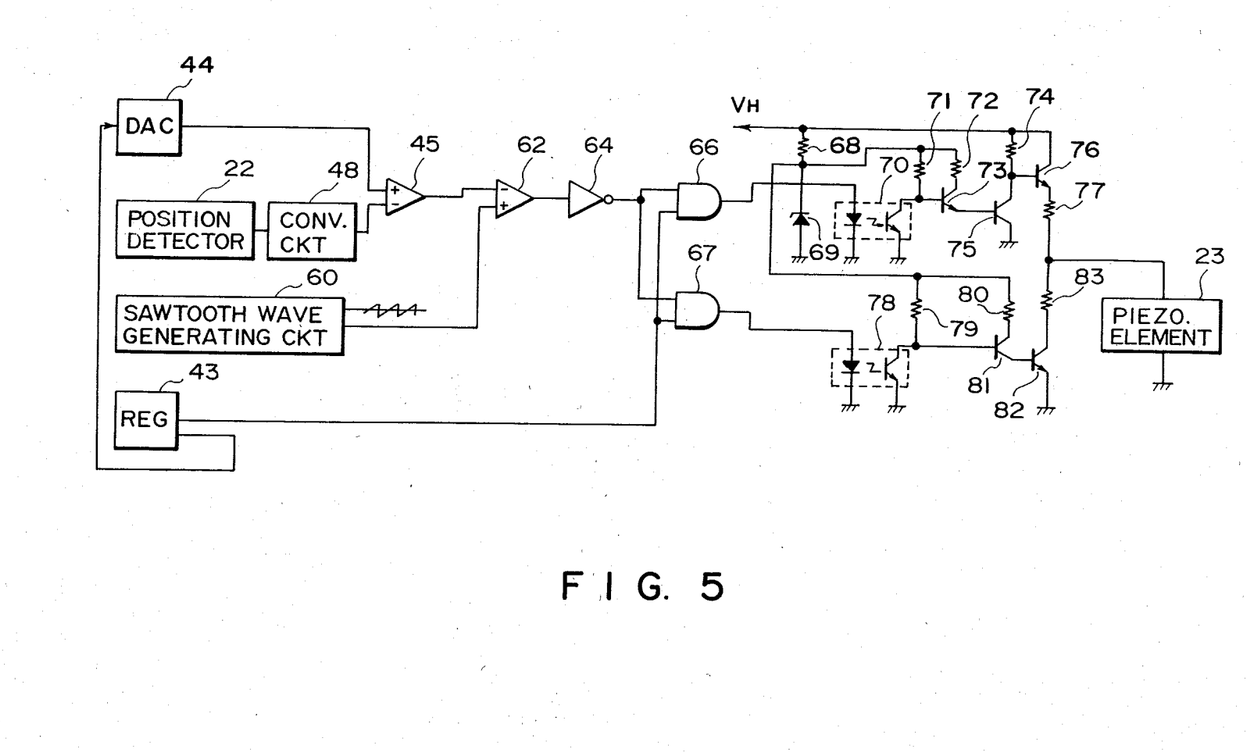
FIG. 5 is a block diagram showing a servo system of the alignment apparatus shown in FIG. 2.

FIG. 5 is a block diagram showing a servo system of the alignment apparatus shown in FIG. 2. In this Figure, elements denoted by reference numerals 60–83 constitute the piezoelectric device driving voltage generating circuit 46 which has been described with reference to FIG. 4. Among these elements, one denoted by reference numeral 60 is a sawtooth wave generating circuit, providing oscillation of sawtooth waves of approx. 10 KHz. The element denoted by 62 is a comparator for comparing the output of the differential amplifier 45 with the output of the sawtooth wave generating circuit 60. On the basis of the results of comparison, the comparator 62 supplies an inverter 64 with an output in the form of a digital signal of "0" or "1". With the comparison of the outputs of the differential amplifier 45 and the sawtooth wave generating circuit 60 by means of the comparator 62, an output having been subjected to pulse width modulation is provided.

The inverter 64 inverts the output of the comparator 62 and supplies the inverted output to AND circuits 66 and 67. If the register 43 provides an output of "0" (i.e. "OFF") which represents that the piezoelectric device should not be driven, both of the AND circuits 66 and 67 supply "0" outputs independently of the output of the differential amplifier 45. By this, the piezoelectric device 23 is discharged or maintained in a discharged state. When the piezoelectric device 23 is to be servo-loop driven, an output "1" (i.e. "ON") of the register 43 representing that the piezoelectric device should be driven is supplied by the microprocessor 40. As a result, each of the AND circuits 66 and 67 transmits the output from the differential amplifier 45, in the form of a signal subjected to pulse width modulation by the comparator 62, to photo-couplers 70 and 78.

If the AND circuit 66 provides an output of "0" (i.e. "OFF"), the photo-coupler 70 is in its "OFF" position, transistor 73 is in an "ON" state, transistor 75 is in an "ON" state, while transistor 76 is in an "OFF" state. Thus, the piezoelectric device 23 is not charged. If, on the other hand, the AND circuit 66 provides an output of "1" (i.e. "ON"), the photo-coupler circuit 70 is in its "ON" position, transistor 73 is an "OFF" state, transistor 75 is in an "OFF" state, while transistor 76 is in an "ON" state. Thus, the piezoelectric device 23 is charged.

If the AND circuit 67 provides an output of "0" (i.e. "OFF"), the photo-coupler 78 is in its "OFF" position, transistor 81 is in an "ON" state and transistor 82 is an "ON" state, so that the piezoelectric device 23 is discharged. If, on the other hand, the AND circuit 67 provides an output of "1" (i.e. "ON"), the photo-coupler 78 is in its "ON" position, transistor 81 is in an "OFF" state and transistor 82 is in an "OFF" state, so that the piezoelectric device 23 is not discharged. The possible combinations of the outputs of the AND circuits 66 and 67 are a couple of signals of "0" and "0", and a couple of signals "1" and "1", only. These combinations are shown in the following Table 1:

TABLE 1

| SIGNAL OF REGISTER 43 REPRESENTING WHETHER OR NOT PIEZO. DEVICE IS TO BE DRIVEN | 1 | | 0 | |
|---|---|---|---|---|
| OUTPUT OF INVERTER 64 | 1 | 0 | 1 | 0 |
| OUTPUT OF EACH OF "AND" CIRCUITS 66 & 67 | 1 | 0 | 0 | 0 |
| TRANSISTOR 76 | ON | OFF | OFF | OFF |
| TRANSISTOR 82 | OFF | ON | ON | ON |
| PIEZO. DEVICE 23 | * | *** | *** | *** |

*CHARGED
***DISCHARGED

The piezoelectric device 23 comprises a stack of plural piezoelectric elements (called a "piezo-stack"). In this embodiment, the piezo-stack comprises a stack of one hundred (100) sheets of piezoelectric elements each having a thickness of approx. 0.5 mm, and is adapted to provide a displacement of 30 microns upon application of a voltage of 400 V. The piezoelectric device can be considered as an equivalent circuit of a capacitor, and the piezoelectric device of this embodiment has a capacitance of 0.01 μF. When the transistor 76 is in its "ON" state and the transistor 83 is in its "OFF" state, the piezoelectric device 23 is charged by a power source $V_H$ through a resistor 77 so that it expands in the direction of the optical axis, i.e. in the Z-axis direction. When the transistor 76 is in the "OFF" state and the transistor 82 is in the "ON" state, the electric charges accumulated in the piezoelectric device 23 are taken away through a resistor 83 so that the electric potential is decreased, whereby the piezoelectric device 23 contracts in the direction of the optical axis, i.e. in the Z-axis direction. The voltage source $V_H$ has a voltage level of 400 V. A resistor 68 is provided to drop the voltage. There is also provided a Zener diode 69 which functions as a constant voltage source for preventing an excessive voltage from being applied to the photo-couplers 70 and 78. Designated by reference numerals 71, 72, 74, 79 and 80 are collector resistors of the transistors. The element denoted at 77 is a resistor for charging the piezoelectric device, while the element denoted at 83 is a resistor for the electric discharge thereof, using 240 KΩ. Thus, the charging/discharging time constant of the piezoelectric device is 2–5 msec.

The operation of the servo system of the embodiment will now be described. In an initial state, the register 43 outputs a signal representing that the control is unnecessary, so that the piezoelectric device 23 is fully discharged. When the movement of the wafer 4 in the direction of the optical axis (in the Z-axis direction) by the pulse motor 33 is completed, the register 43 outputs a signal representing that the control is necessary. Simultaneously therewith, the register 43 applies to the D/A converter 44 an output instructing the drive of an amount corresponding to a half of the maximum amount of drive, that is instructing 15-micron displacement. Responsive thereto, the D/A converter 44 outputs an analog voltage of 5 V, corresponding to the 15-micron drive, which is supplied to the differential amplifier 45. On the other hand, the eddy current type position detector 22 is arranged to provide such an output that causes the displacement-to-voltage converter circuit 48 to output a voltage of 5 V, when the 15-micron displacement is detected.

However, during the period just after the initial state, the piezoelectric device 23 is maintained in the discharged state so that any expansion or displacement does not yet occur. Therefore, the displacement-to-voltage converter 48 produces an output of 0 V which in turn is supplied to the differential amplifier 45. Since the amount of feedback from the displacement-to-voltage converter 48 is small, the differential amplifier 45 produces an output of a high positive voltage. Since the output voltage of the differential amplifier 45 is greater than that of the sawtooth wave generating circuit 60, the comparator 62 generates substantially zero (OFF) outputs so that it causes, by way of the inverter 64, the AND circuits 66 and 67 to produce "1" outputs. This continues to charge the piezoelectric device 23. With the increase in the amount of charge accumulation, the piezoelectric device 23 produces increasing displacement by increasing expansion. Thus, the displacement-to-voltage converter circuit 48 produces an output which is proportional to the displacement. With the lapse of time, the displacement approaches a value of 15 microns so that the displacement-to-voltage converter circuit 48 produces a voltage which is close to 5 V. As a voltage near the output voltage of the D/A converter 44 (drive instruction voltage) is fed back from the output of the displacement-to-voltage converter circuit 48 (displacement voltage), the output of the differential amplifier 45 approaches 0 V. When the output of the differential amplifier 45 approaches 0 V, it has a level substantially corresponding to the center level of the output voltage of the sawtooth wave generating circuit 60. Thus, the comparator 62 repeatedly produced "0" (OFF) and "1" (ON) outputs having substantially the same duration or width, at a frequency equal to the oscillation frequency of the sawtooth wave generating circuit 62. When the output signals of the comparator 62 comprise repetition of "0" signals substantially the same duration or time width, the charging amount and the discharging amount of the piezoelectric device 23 become equal to each other so that the terminal voltage of the piezoelectric device 23 is converged.

Feedback is performed in this manner and a stable state is established when the drive instruction voltage and the displacement voltage become equal to each other, which means that the piezoelectric device 23 has achieved a desired amount (15 microns) of driving movement. As described in the foregoing, by initially setting the 15-micron displacement which is a half of the maximum amount of drive, the succeeding adjustment can be made quickly.

Subsequently, the surface position of the wafer 4 is again measured by the air-sensor nozzles 34–37. If the distances measured by the nozzles 34–37 are denoted by $d_9$–$d_{12}$, the amount of drive of the piezoelectric device 23 which is to be newly set is given by:

$$\Delta d_2 = d_0 - (d_9 + d_{10} + d_{11} + d_{12})/4.$$

As described above, the amount $\Delta d_2$ is within the range of 2 microns because of the preceding adjustment. Therefore, the microprocessor 40 supplies the register 43 with a signal corresponding to a value which is equal to the sum of the amount of the initial drive (15 microns), through which the piezoelectric device 23 has already been driven, and the newly set amount of drive $\Delta d_2$. Responsive thereto, the register 43 newly generates a drive instruction voltage and the differential amplifier 45 amplifies the error or difference. When the output of the displacement-to-voltage converter circuit 48 (displacement voltage) becomes equal to the drive instruction voltage, the terminal voltage of the piezoelectric device converges and the predetermined drive is completed.

Figure 6A:
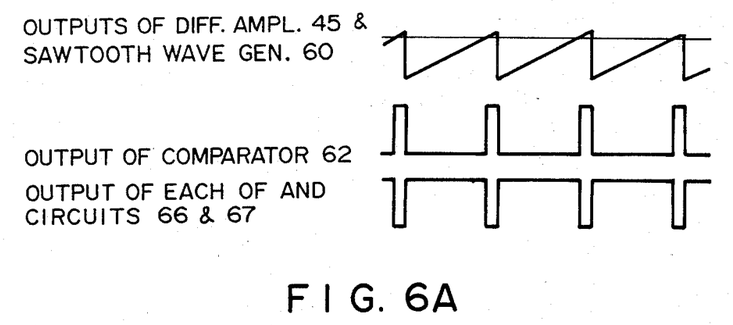
FIGS. 6A–6C are waveform views showing changes in the servo output depending on the position of a wafer.
Figure 6B:
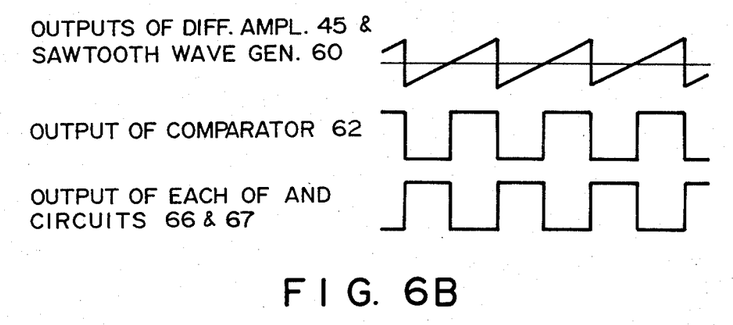
Figure 6C:
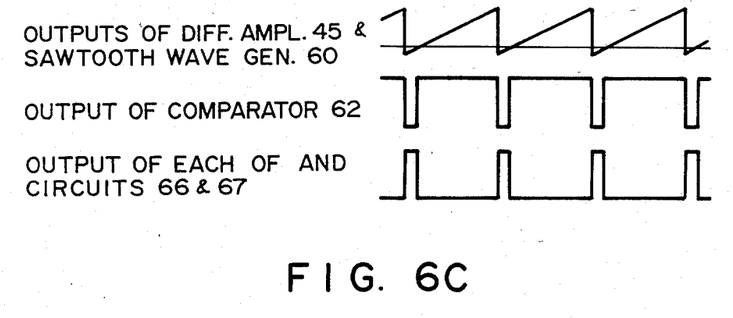

FIGS. 6A–6C are signal waveform views illustrating the pulse width modulation of the output signal of the sawtooth wave generating circuit 60 by the comparator 62. FIG. 6A corresponds to a case where the expansion of the piezoelectric device 23 is less than the instructed value of drive. Since the displacement voltage is lower than the drive instruction voltage, the differential amplifier 45 generates a higher voltage which is then compared with the sawtooth wave voltage by the comparator 62. Thus the comparator 62 produces an output having a smaller width at its "1" level portion. This signal is inverted by the AND circuits 66 and 67 into a signal having a larger width at its "1" level portion, that is a signal for charging the piezoelectric device 23.

FIG. 6B is a case where the expansion of the piezoelectric device 23 substantially corresponds to the instructed value of drive. Since, the drive instruction voltage and the displacement voltage are substantially equal to each other, the differential amplifier 45 generates an intermediate voltage which is then compared with the sawtooth wave voltage by the comparator 62. Thus the comparator 62 produces an output having substantially the same width at its "1" and "0" level portions. Although this signal is inverted by the AND circuits 66 and 67, the inverted signal is such that it equalizes the charging and the discharging of the piezoelectric device 23 because the difference in the width between the "1" level portion and the "0" level portion is small.

FIG. 6C corresponds to a case where the expansion of the piezoelectric device 23 is greater than the instructed value of the drive. Since the displacement voltage is higher than the drive instruction voltage, the differential amplifier 45 generates a lower voltage which is then compared with the sawtooth wave voltage by the comparator 62. Thus, the comparator 62 generates an output having a larger width at its "1" level portion. This signal is inverted by the AND circuits 66 and 67 into a signal having a smaller width at its "1" level portion, i.e. the signal for discharging the piezoelectric device 23.

Figure 7:
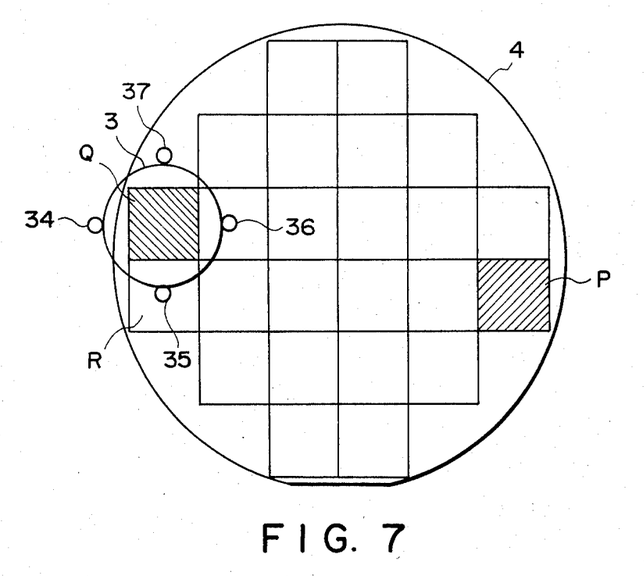
FIG. 7 is a plan view of a wafer showing the arrangement of shots and the positional relation of the nozzles of the air-microsensors.

FIG. 7 is a plan view of the wafer 4 showing the arrangement of the shots as well as the positional relation between the reduction projection lens 3 and the air-sensor nozzles 34–37. The area denoted by a reference character P in this Figure is a pattern area to be exposed upon one shot. In a projection exposure apparatus of a step-and-repeat type, the wafer 4 carried by the wafer stage 5 is moved in the X and Y directions for die-by-die exposure.

In a case where an area denoted by reference character Q is to be exposed, the reduction projection lens 3 and the air-sensor nozzles 34–37 will be positioned relative to the wafer such as shown in this Figure. Therefore, the air-sensor nozzle 34 can not detect or measure the surface position of the wafer. More particularly, as the wafer 4 is moved toward the reduction projection lens 3, the microprocessor 40 detects that the wafer surface has sufficiently entered into the measurement ranges of the air-sensor nozzles 35, 36 and 37. However, no response is inputted from the air-sensor nozzole 34 to the microprocessor 40. For this reason, the microprocessor 40 judges the air-sensor nozzle 34 to be unmeasurable and averages the measurement values $d_2$, $d_3$ and $d_4$ of the air-sensor nozzles 35, 36 and 37. Whereby, an average distance $(d_2+d_3+d_4)/3$ to the wafer 4 is calculated. The focus adjustment is performed on the basis of the results of calculation.

When an area denoted by R is to be exposed after completion of the exposure of the area Q, the air-sensor nozzle 35 preparatively detects the position of the wafer surface at the area R and measures the distance thereat upon the time at which the exposure of the area Q is completed. The measured value is supplied by the microprocessor 40 to the register 43 as an instructed amount of drive. When the wafer 4 is moved so that the exposure area R is positioned below the reduction projection lens 3, the piezoelectric device 23 starts driving and the amount of drive thereof is detected by the eddy current type position detector 22 so that the drive is completed. In this manner, the focus adjustment with respect to the exposure area R can be achieved during the movement of the wafer 4 from the Q-area-exposing position to the R-area-exposing position. This ensures exposure with decreased waste time since a requisite time period for executing one operation can be utilized for another operation.

Figure 8:
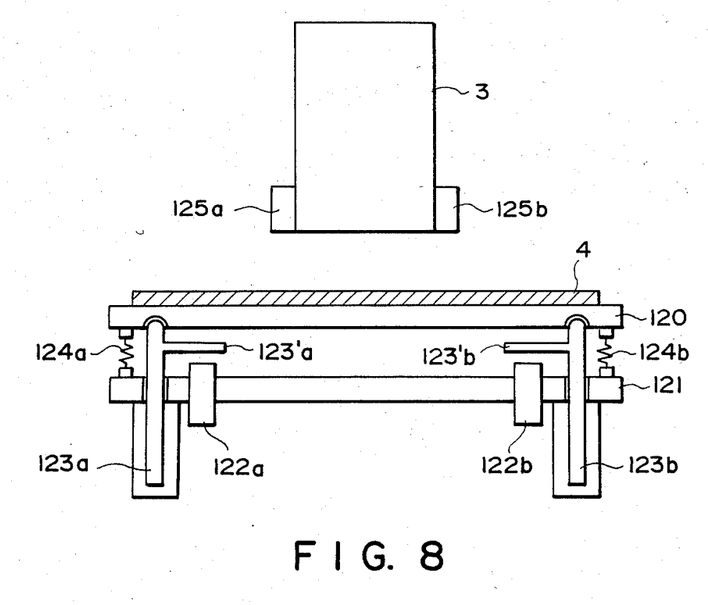
FIG. 8 is a cross-sectional view showing an alignment apparatus according to another embodiment of the present invention.

FIG. 8 shows an alignment apparatus according to another embodiment of the present invention. This embodiment differs from the foregoing embodiment in the point that, even if the entire surface of the wafer 4 is not even or regular, the wafer 4 surface can be coincident with the imaging plane of the projection lens 3.

As shown in FIG. 8, the wafer 4 is held by a wafer chuck 120. A base member 121 for the wafer chuck 120 is provided with three equiangularly disposed piezoelectric devices 123a, 123b and 123c (only two of them are shown in this Figure). Similarly to the foregoing embodiment, each piezoelectric device comprises a stack of multiple piezoelectric elements or chips. With the driving movement of the piezoelectric devices, the wafer chuck 120 is moved in the direction of the Z-axis, i.e. longitudinally as viewed in this Figure. Eddy current type position detectors 122a, 122b and 122c (only two of them are shown in this Figure) are located at the positions corresponding respectively to the positions of the piezoelectric devices 123a, 123b and 123c. Each of the eddy current type position detectors 122a–122c is adapted to measure the distance between the base member 121 and a protrudent portion 123'a, 123'b or 123'c of the drive shaft of an associated one of the piezoelectric devices to thereby measure the amount of drive to be made by an associated one of the piezoelectric devices. On the side of the reduction projection lens 3, nozzles 125a, 125b and 125c (only two of them are shown in this Figure) of air-microsensors are mounted. On the basis of the changes in the flow rate or back pressure of the air blown off from each nozzle, the distance from the nozzle to the wafer 4 surface can be measured. The apparatus further includes coil springs 124a, 124b and 124c (only two of them are shown in thie Figure) for connecting the wafer chuck 120 with the base member 121 and for urging the piezoelectric devices 123a, 123b and 123c so that the tip ends of the piezoelectric devices contact and follow corresponding concavities formed in the wafer chuck 120. The piezoelectric devices, eddy current type position detectors and coil springs constitute three sets of measuring systems which are spaced from each other through an angular distance of 120 degrees with respect to the center of the base member 121. Also, the nozzles of the air-microsensors are spaced from each other through an angular distance of 120 degrees with respect to the center of the reduction projection lens 3, so that their positions correspond to those of the piezoelectric devices.

Figure 9:
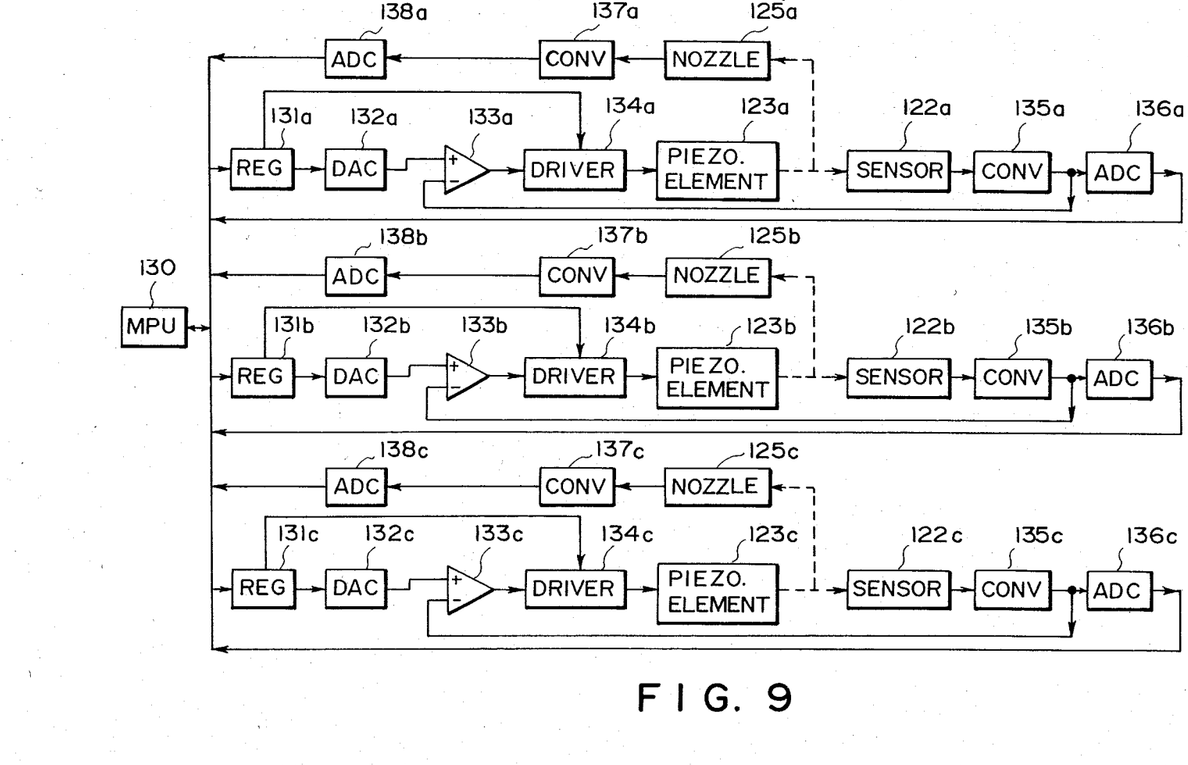
FIG. 9 is a block diagram showing a control system of the alignment apparatus shown in FIG. 8.

FIG. 9 is a block diagram showing the drive control system of the embodiment shown in FIG. 8. As shown in FIG. 9, the drive control system includes a microprocessor unit (MPU) 130 for performing various discriminating operations and supplying various instructions in accordance with different situations. The system further includes registers 131a, 131b and 131c for storing "ON" signals (i.e. actuation signals) or "OFF" signals (i.e. deactuation signals) to be supplied to the piezoelectric devices 123a, 123b and 123c, respectively, and signals representing the set amount of drive to be supplied to the piezoelectric devices. The registers are adapted to supply the aforementioned "ON" or "OFF" signals to driver circuits 134a, 134b and 134c, respectively, for generating piezoelectric device driving voltages, and to supply the aforementioned signals representing the amounts of drive for the piezoelectric devices to digital-to-analog converters (DAC) 132a, 132b and 132c, respectively.

In an initial state, the microprocessor 130 outputs an "ON" signal (actuation signal) for each piezoelectric device and an instruction signal designating the drive of an amount which corresponds to one-half of the maximum amount of drive of the piezoelectric device. In response thereto, each of the D/A converters 132a, 132b and 132c applies a voltage of 5 V, as a driving amount instructing voltage (instruction voltage), to an associated one of differential amplifiers 133a, 133b and 133c. Since, at this time, each of the piezoelectric devices 123a, 123b and 123c is in its initial state, it is in the discharged state so that the amount of drive is zero. Therefore, an output of each of displacement-to-voltage converter circuits 135a, 135b and 135c (feedback voltage) obtainable through an associated one of the eddy current type position detectors 122a, 122b and 122c is at 0 V. The drive control system is arranged to provide a feedback voltage of 10 V when the amount of drive of the piezoelectric device is maximum and a feedback voltage of 5 V when the amount of drive is one-half of the maximum amount. Each differential amplifier 133a, 133b or 133c continues to apply outputs to an associated one of the driver circuits 134a, 134b and 134c until the feedback voltage becomes equal to the instruction voltage, to drive an associated one of the piezoelectric devices 123a, 123b and 123c. When the amount of drive of the piezoelectric device becomes equal to one-half of the maximum amount of drive, the voltage output is converged and stabilized. At this time, the microprocessor 130 reads out the feedback voltages from analog-to-digital converters (ADC) 136a, 136b and 136c so that the amount of drive of each of the piezoelectric devices is confirmed. Thereafter, the microprocessor 130 instructs measurement of the distance between the wafer surface and each of the nozzles 125a, 125b and 125c with the aid of voltage converting circuits 137a, 137b and 137c and analog-to-digital converters (ADC) 138a, 138b and 138c. Since the positional relation between each nozzle and corresponding one of the piezoelectric devices is previously determined at each position on the wafer stage (i.e. in the X-Y plane), the microprocessor 130 corrects the measurement value for the distance between each nozzle and the wafer surface while taking into account the above-described positional relation, and computes the amount of drive to be made by each piezoelectric device, such that the wafer surface becomes parallel to the plane in which the tips of the nozzles are positioned and, more specifically, such that the wafer surface becomes coincident with the imaging plane of the reduction projection lens 3.

On the basis of results of computation or calculation, the microprocessor 130 causes each of the registers 131a, 131b and 131c to store therein the amount of the drive of corresponding one of the piezoelectric devices and to start the drive of the piezoelectric device. Since each piezoelectric device is initially set at a position corresponding to one half of the range of driving movement, it can be driven in either of directions of expansion and contraction. Until the feedback voltage becomes equal to the instruction voltage produced at each of the D/A converters 132a, 132b and 132c in accordance with the instructed amount of drive supplied to each of the registers, real-time and closed-loop drive control is executed with respect to each of the piezoelectric devices, so that it is driven by an amount corresponding to the instructed amount of drive. In this manner, each eddy current sensor is adapted to detect the amount of drive of only an associated one of the piezoelectric devices and is not affected by the driving movement of any another piezoelectric devices. Therefore, the drive control for each piezoelectric device is stable, which assures highly precise position control with a simple circuit configuration and with a decreased time until the adjustment is terminated.

After the control of the piezoelectric devices is completed, the microprocessor 130 again instructs measurement of the distance between each nozzle and the wafer surface, and discriminates whether or not the wafer surface is positioned in a plane parallel to the plane in which the tips of all the nozzles are positioned. If the distance measured by each nozzle contains an error or difference not less than a predetermined value, the microprocessor 130 again computes the amount of drive to be made by each piezoelectric device on the basis of the measurement value, and instructs the drive of each piezoelectric device. Until the error falls within a predetermined range, the microprocessor 130 repeats the above-described operations. Actually, however, the error will be diminished and will become not greater than a predetermined permissible value (e.g. 1 micron) only by one or two times of additional driving movement of the piezoelectric device. This will be because of the following reasons:

(1) The measurement precision, resolution and linearity of the air-microsensor are good (measurement range: 200 microns).

(2) The measurement precision, resolution and linearity of the eddy current type position detector are good.

(3) The apparatus does not include any mechanical linkage for the drive of the piezoelectric device, so that there is no mechanical element causing a time lag or operational instability.

(4) The eddy current time position detector detects the amount of drive of one particular piezoelectric device, so that it is not affected by the driving movement of any other piezoelectric devices.

While the foregoing embodiments have been described with reference to a stepper (reduction projection exposure apparatus), the present invention is applicable to any other types of exposure apparatuses. Particularly, in an exposure apparatus using a reflection mirror optical system for performing the whole surface exposure with one shot, the advantageous effects of the present invention become remarkably notable. In this type of exposure apparatus, the area to be exposed with one shot is large, so that the surface irregularity in the area to be exposed is great. In such case, the central portion of the wafer chuck also may be provided by a movable element which can be driven by the driving mechanism of the present invention having the second detector for detecting the amount of drive, to thereby achieve flatness-correction of the wafer.

The first position-detector is not limited to the air-microsensor. When an ultrasonic wave reflecting type displacement gauge, photoelectric reflection type displacement gauge or eddy current type displacement gauge is used, the position can be detected even in a vacuum. Therefore, the alignment system of the present invention is applicable also to X-ray exposure apparatuses and electron-beam exposure apparatuses. Further, the present invention can be easily incorporated into an apparatus having a combination of a microscope and an X-Y stage, such as a mask defect inspecting apparatus or a mask comparator/inspector apparatus.

While the foregoing embodiments have been described with reference to positioning of the wafer, the present invention is applicable also to the positioning of a mask or reticle. Moreover, the second detector is not limited to the eddy current type displacement gauge. It may be provided by e.g. an electrostatic capacitance type displacement gauge which also achieves precise measurement. As for the drive source, use of a linear-motion drive source achieving direct drive, such as the piezoelectric device employed in the disclosed embodiments of the present invention or a linear motor, eliminates the necessity of any mechanical linkage. Therefore, any insensitive or uncontrollable range such as a backlash is prevented, ensuring precise position control and a higher response speed. However, a rotational drive source may of course be used.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for aligning an object with an imaging plane of an optical system, comprising:
    a first detecting means for detecting the position of the object with respect to the imaging plane of the optical system;
    displacement means for changing the positioning relation of the object relative to the imaging plane of the optical system;
    a second detecting means for detecting the amount of change in the positional relation of the object relative to the imaging plane of the optical system by said displacement means; and
    control means for controlling said displacement means on the basis of the results of detection by said first and second detecting means, said control means comparing sequentially the results of detection by said first and second detecting means with each other and controlling said displacement means so that the results of detection by said first and second detecting means co-ordinate with each other.

2. An apparatus according to claim 1, wherein said second detecting means includes an eddy current type position detector.

3. An apparatus according to claim 2, wherein said displacement means includes an electrostrictive element.

4. An apparatus according to claim 3, wherein said first detecting means includes an air-microsensor.

5. An apparatus according to claim 4, wherein said control means includes a processing means for generating a signal corresponding to the difference between the result of detection by said first detecting means and that detected by said second detecting means, comparing means for binarizing a sawtooth wave signal on the basis of the signal produced by said processing means, and switching means for controlling charging/discharging of said electrostrictive element in accordance with an output from said comparing means.

6. An alignment apparatus comprising:
    an electrostrictive element;
    detecting means for detecting the amount of change in said electrostrictive element; and
    control means for controlling charging/discharging of said electrostrictive element on the basis of the difference between the amount of change detected by said detecting means and a predetermined set amount.

7. An apparatus according to claim 6, wherein said control means includes a first circuit at a lower voltage for obtaining the difference between the amount of change detected by said detecting means and the predetermined set amount, and a second circuit at a higher voltage for executing charging/discharging of said electrostrictive element.

8. An apparatus according to claim 7, wherein said control means includes a photo-coupler for transmitting an output of said first circuit to said second circuit.

9. An apparatus according to claim 8, wherein said first circuit includes an operational amplifier for generating a signal corresponding to the difference between the amount of change detected by said detecting means and the predetermined set amount, and a comparator for binarizing a sawtooth wave signal on the basis of the signal produced by said operational amplifier.

10. An apparatus according to claim 9, wherein said second circuit includes a plurality of transistors which are adapted to be controlled on the basis of the output from said photo-coupler.

11. An apparatus according to claim 6, wherein said control means includes a pulse generating circuit for producing a pulse signal for controlling charging/discharging of said electrostrictive element, and a duty changing circuit for changing the duty in the pulse signal produced by said pulse generating circuit.

12. An apparatus for aligning a flat object with an imaging plane of an optical system, comprising:
    a plurality of first detecting means, each of said first detecting means detecting the position of the object with respect to the imaging plane of the optical system;
    a plurality of displacement means, each of said displacement means changing the positional relation of an associated portion of the object relative to the imaging plane of the optical system;
    a plurality of second detecting means, each of said second detecting means detecting the amount of change in the positional relation between an associated portion of the object relative to the imaging plane of the optical system by an associated one of said displacement means, independently from the change by the remaining displacement means; and control means for controlling each of said plural displacement means individually on the basis of the result of detection by an associated one of pairs of said first and second detecting means.

13. An apparatus according to claim 12, wherein the apparatus includes the same number of said plural first detecting means, said plural second detecting means and said plural displacement means.

14. An apparatus according to claim 13, wherein each of said second detecting means detects directly the amount of change by an associated one of said displacement means.

15. An apparatus according to claim 14, wherein each of said displacement means includes an electrostrictive element.

16. An apparatus according to claim 15, wherein each of said second detecting means includes an eddy current type position detector.

* * * * *